United States Patent

Kano

[11] Patent Number: 5,912,502
[45] Date of Patent: Jun. 15, 1999

[54] WAFER HAVING A PLURALITY OF IC CHIPS HAVING DIFFERENT SIZES FORMED THEREON

[75] Inventor: Isao Kano, Tokyo, Japan

[73] Assignee: NEC Corporation, Tokyo, Japan

[21] Appl. No.: 09/041,505

[22] Filed: Mar. 12, 1998

[30] Foreign Application Priority Data

Mar. 12, 1997 [JP] Japan .................................... 9-057730

[51] Int. Cl.⁶ .................................................... H01L 21/02
[52] U.S. Cl. ............................ 257/620; 257/48; 257/207
[58] Field of Search ............................ 257/48, 207, 618, 257/620, 723, 786, 784; 438/128, 455, 458, 460, 462, 597, 598

[56] References Cited

U.S. PATENT DOCUMENTS 5,341,024   8/1994   Rosotker ................................. 257/620

Primary Examiner—Tom Thomas
Assistant Examiner—Luan Thai

[57] ABSTRACT

In a wafer having a plurality of integrated circuit chips of different chip sizes formed on the wafer, each of the integrated circuit chips having a number of externally connecting lands uniformly distributed over the whole surface of the chip with equal pitches to depict a matrix or a repeated pattern of an equilateral triangle, a plurality of power supply lands of the externally connecting lands are located to depict a cross having a crossing point positioned at a center of the chip. A geometrical location of the power supply lands is congruent to all said integrated circuit chips of different chip sizes. The pitch between adjacent lands positioning a dicing line therebetween is one obtained by multiplying the pitch between adjacent lands positioning no dicing line therebetween, by a positive integer.

11 Claims, 4 Drawing Sheets

101 IC CHIP
102 EXTERNAL CONNECTING LAND

201 IC CHIP
202 EXTERNAL CONNECTING LAND

WAFER HAVING A PLURALITY OF IC CHIPS HAVING DIFFERENT SIZES FORMED THEREON

BACKGROUND OF THE INVENTION

1. Field of the Invention

The present invention relates to a semiconductor device, and more specifically to a single wafer having a plurality of integrated circuit chips having different chip sizes formed on the single wafer, for a high density packaging.

2. Description of Related Art

Japanese Patent Application Pre-examination Publication No. JP-A-04-373131 (the content of which is incorporated by reference in its entirety into this application and also an English abstract of JP-A-04-373131 is available from the Japanese Patent Office and the content of the English abstract of JP-A-04-373131 is also incorporated by reference in its entirety into this application) discloses two prior art IC (integrated circuit) chips, one of which is shown in FIG. 1, and the other of which is shown in FIG. 2. The IC chip 101 shown in FIG. 1 includes a plurality of external connection lands (simply called "lands" hereinafter) 102 located on only a periphery of the IC chip. The IC chip 201 shown in FIG. 2 includes a number of lands 202 located over the whole of the IC chip with a predetermined constant pitch to form a matrix of the lands.

In the type shown in FIG. 1, when a plurality of IC chips having different chip sizes are formed, the positional relation of each land from a center of the chip is different from one chip to another.

Therefore, when a plurality of IC chips having different chip sizes are formed on a single wafer, at the time of carrying out a function text under a wafer condition it is difficult to use a testing tool (for example, a probe card) in common to all the IC chips of the different chip sizes. The reason for this is that, since power supply voltage supplying positions are geometrically determined in the probe card, the power supply voltage supplying positions cannot be easily changed by modifying the setting of a signal processing apparatus connected to the probe card. Therefore, if the probe for supplying the power supply voltage is contacted to an adjacent different chip, a current flows in the adjacent chip, with the result that a proper test result can be no longer obtained.

On the other hand, since the geometrical location of the lands is normalized in the type shown in FIG. 2, when a plurality of IC chips having different chip sizes are formed, the positional relation of each land from a center of the chip is unified among the IC chips of the different chip sizes. Therefore, when it is intended to form a wafer having a plurality of IC chips having different chip sizes formed thereon, the type shown in FIG. 2 is excellent from the viewpoint that masks and probes can be used in common to the IC chips of the different chip sizes.

However, when the wafer is cut out into individual chips, if the pitch of the lands is small, it becomes difficult to form a dicing line, because a cutting margin for the dicing (for example, the thickness of a blade of the dicing saw plus a deviation margin, or a diameter of a laser beam in the case of a laser beam cutting) inevitably limits the interval of the lands. In particular, when a plurality of IC chips having different chip sizes are formed on a single wafer, since the dicing becomes more difficult than an ordinary case in that the IC chips of the same size are formed on a single wafer, a sufficient cutting margin is required.

Recently, the wafer used in manufacturing a semiconductor integrated circuits has become large, and has reached 12 inches in diameter in a mass production. In a logic circuit LSI (large scale integrated circuit), on the other hand, "many-kinds but small-production" has become spread. Therefore, in a logic LSI having only a small production amount required, when the logic LSIs of the number corresponding to one wafer were produced, the production becomes excessive, with the result that most of the LSI produced must be disposed.

In order to overcome this problem, if a plurality of kinds of chip having different chip sizes can be formed on a single wafer, a production having no waste becomes possible. In this case, however, a wasteful chip is not produced, but it becomes necessary to previously prepare a testing tool (for example, a probe card) fitted to each of the different chip sizes, in order to carry out the function test in a wafer condition, and also it becomes necessary to replace the testing tool from one kind of chip to another kind. As a result, the efficiency of production becomes low. Therefore, a countermeasure for overcoming this problem is now demanded.

SUMMARY OF THE INVENTION

Accordingly, it is an object of the present invention to provide a semiconductor device which has overcome the above mentioned defect of the conventional one.

Another object of the present invention is to provide a wafer having a plurality of integrated circuit chips having different chip sizes formed thereon, capable of making it possible to use a common testing tool in the function testing under a wafer condition.

Still another object of the present invention is to provide a wafer having a plurality of integrated circuit chips having different chip sizes formed thereon, capable of easily carrying out the dicing of the wafer.

The above and other objects of the present invention are achieved in accordance with the present invention by a wafer having a plurality of integrated circuit chips of different chip sizes formed on the wafer, each of the integrated circuit chips having a number of externally connecting lands uniformly distributed over the whole surface of the chip with equal pitches in at least two different directions, a geometrical location of a plurality of power supply lands of the externally connecting lands being congruent to all the integrated circuit chips of different chip sizes.

In one embodiment, the at least two different directions includes two directions orthogonal to each other, so that the number of externally connecting lands are distributed over the whole surface of each chip in the form of a matrix, and the plurality of power supply lands are located to depict a cross having a crossing point positioned at a center of the chip.

In another embodiment, the at least two different directions includes three different directions angularly separated from one another by the same angle, so that the number of externally connecting lands are distributed over the whole surface of each chip in such a manner that each three adjacent lands are positioned at three vertexes of an equilateral triangle, respectively, and therefore, a repeated pattern of the equilateral triangle is depicted by the lands, and the plurality of power supply lands are located to depict a cross having a crossing point positioned at a center of the chip.

In both the embodiments, preferably, the pitch between adjacent lands positioning a dicing line therebetween is one obtained by multiplying the pitch between adjacent lands positioning no dicing line therebetween, by a positive integer.

In the present invention, since the geometrical location of the power supply lands is unified or congruent to all the IC chips of different chip sizes formed on the same wafer, if a testing tool for a function test is prepared to fit with the largest IC chip, power supply positions of the testing tool prepared to fit with the largest IC chip are in common to all the IC chips of different chip sizes. Therefore, if the power supply positions of the testing tool prepared to fit with the largest IC chip are properly contacted to the power supply lands of each of the IC chips of different chip sizes, it is possible to supply a power to the IC chip, regardless of the chip size. Although the power supply positions of the testing tool cannot be easily modified by changing the setting of the processing apparatus connected to the testing tool, it is no longer necessary.

If the plurality of power supply lands are located to depict a cross having a crossing point positioned at a center of the chip, by making the center of each chip consistent with the center of the testing tool, it becomes possible to easily supply a power to the IC chip, regardless of the chip size.

In addition, if the pitch between adjacent lands positioning the dicing line therebetween is one obtained by multiplying the pitch between adjacent lands positioning no dicing line therebetween, by a positive integer, even if the pitch between adjacent lands positioning no dicing line therebetween becomes small, a necessary dicing width can be ensured.

The above and other objects, features and advantages of the present invention will be apparent from the following description of preferred embodiments of the invention with reference to the accompanying drawings.

DESCRIPTION OF THE PREFERRED EMBODIMENTS

Figure 1:
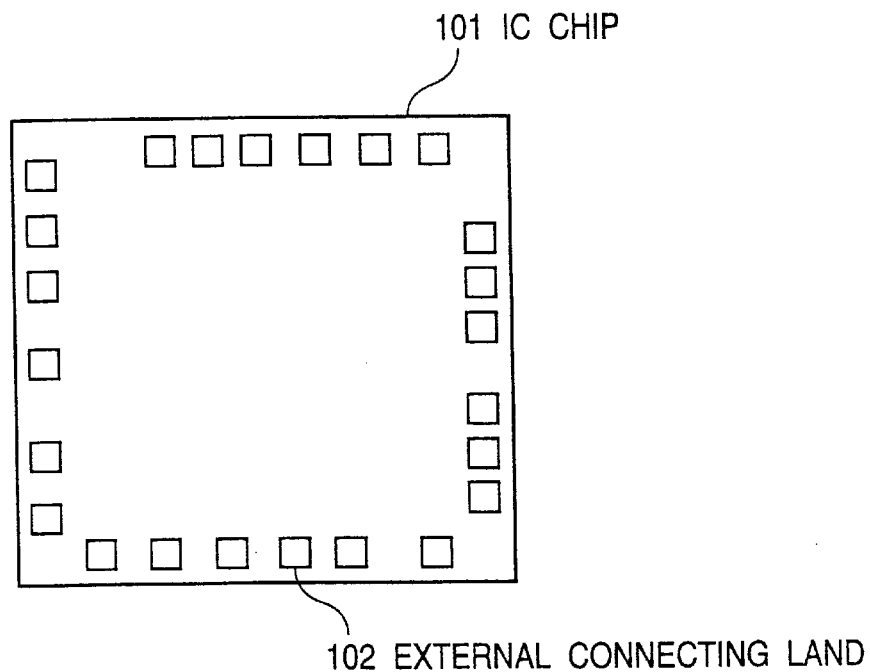
FIG. 1 illustrates the land layout in the first example of the prior art IC chip.
Figure 2:
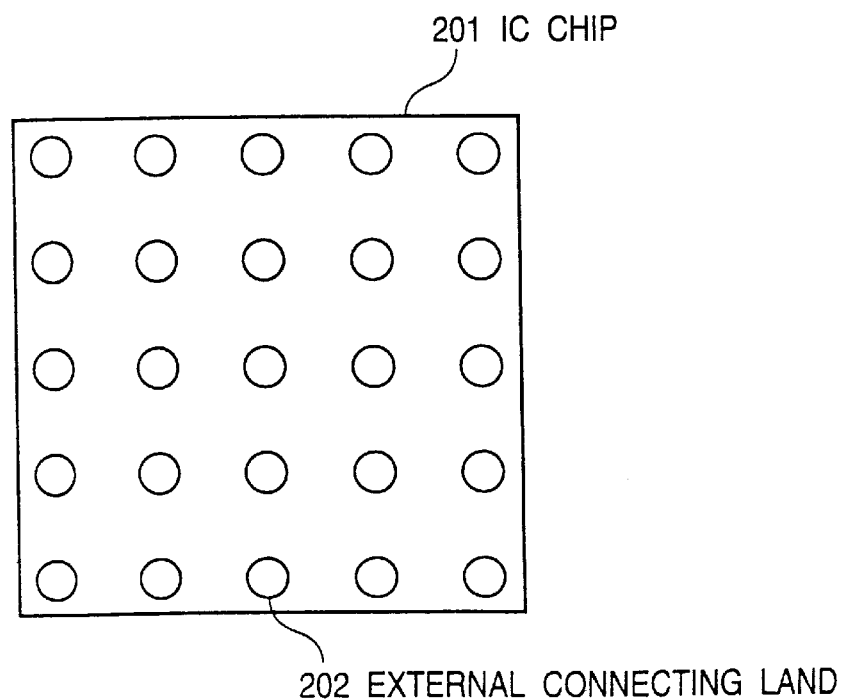
FIG. 2 illustrates the land layout in the second example of the prior art IC chip.
Figure 3:
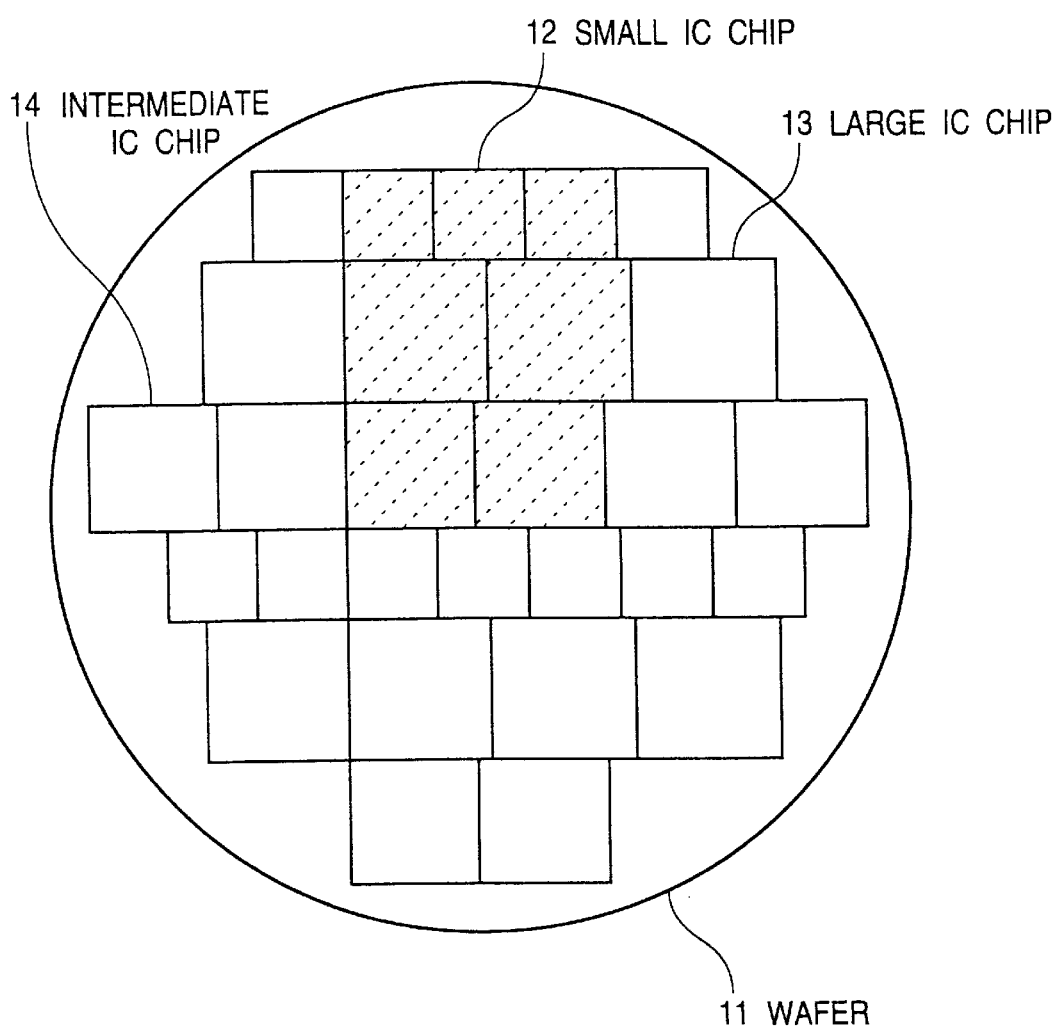
FIG. 3 is a chip layout in a single wafer, for illustrating a first embodiment of the wafer in accordance with the present invention.

Referring to FIG. 3, there is shown a chip layout in a single wafer, for illustrating a first embodiment of the wafer in accordance with the present invention.

In the shown wafer, generally designated with Reference Numeral 11, a plurality of small IC chips 12, a plurality of large IC chips 13, and a plurality of intermediate IC chips 14 are formed.

Figure 4:
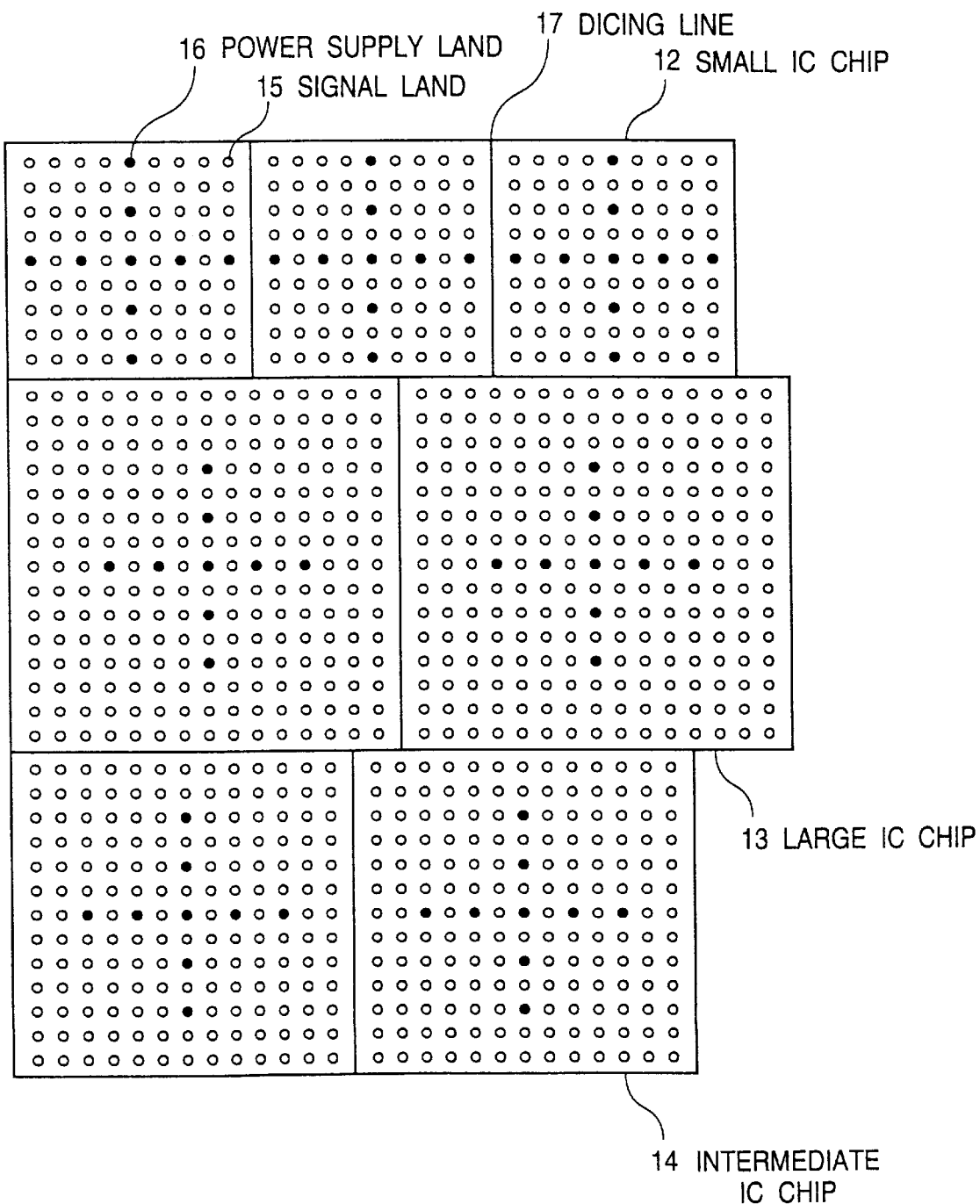
FIG. 4 is a partial enlarged plan view of the wafer shown in FIG. 3.

FIG. 4 is a partial enlarged plan view of the IC chips 12, 13 and 14 hatched with dotted lines, of the wafer 11 shown in FIG. 3. In each of the IC chips 12, 13 and 14, necessary devices (not shown) are formed, and an insulator film (also not shown) is formed to cover the whole surface of the IC chip, as well known to persons skilled in the art. In addition, at a number of positions of the IC chip surface, a portion of the insulator film is removed to expose an underlying conductive film, and a plurality of external signal connecting lands 15 and a plurality of power supplying lands 16 are formed as shown in FIG. 4. In this embodiment, the plurality of power supplying lands 16 are located in the form of a cross having a crossing point positioned one a center of the IC chip.

In FIG. 4, the Reference Numerals 15 and 16 are given only one external signal connecting land and one power supplying land of one small IC chip 12, and are omitted for the other chips for simplification of the drawing. These lands 15 and 16 are plated by a solder or the like to form a bump, as well known to persons skilled in the art. The lands are distributed on the whole surface of the IC chip surface with the same pitch in two orthogonal directions, to form a matrix. In particular, the pitches of the lands is equal, excluding an area of a dicing line 17 partitioning the individual IC chips on the wafer. The pitch between adjacent lands positioning the dicing line 17 therebetween is one obtained by multiplying the pitch between adjacent lands positioning no dicing line therebetween, by a positive integer.

In the following, a more detailed explanation will be made with reference to FIGS. 3 and 4.

As mentioned above, the small IC chips 12, the large IC chips 13 and the intermediate IC chips 14 are located on the single semiconductor wafer 11 as shown in FIG. 3. These IC chips 12, 13 and 14 are square pieces. Necessary devices are formed on and in a surface region of each IC chip, as mentioned above, and the whole surface of each IC chip is covered with an insulator film. At a number of positions of each IC chip surface, a portion of the insulator film is removed to expose an underlying conductive film, and a plurality of external signal connecting lands 15 (72 signal lands 15 in the small IC chip) and a plurality of power supplying lands 16 (9 power supplying lands 16 in the shown embodiment) are formed in the form of a cross having a crossing point positioned on a center of the IC chip. A geometrical location of the 9 power supplying lands 16 is congruent to all the small IC chips 12, the large IC chips 13 and the intermediate IC chips 14. In other words, the geometrical location of the power supplying lands 16 is congruent in all the IC chips 12, 13 and 14.

In this embodiment, the 9 power supplying lands 16 includes one land positioned at the center of each chip to become the crossing point of the cross, and each two lands located on a tip end and an intermediate point of each arm of the cross. These lands 15 and 16 are plated by a solder or the like to form a bump. These lands 15 and 16 are located at the same pitches in a horizontal direction and in a vertical direction orthogonal to each other, to form a matrix in an area excluding the region of the dicing line 17. The pitch between adjacent the lands positioning the dicing line 17 therebetween is one obtained by multiplying the pitch between adjacent the lands positioning no dicing line therebetween, by a positive integer.

Here, it is assumed that, in the embodiment shown in FIG. 4, the small chip 12 includes 72 signal lands and 9 power supply lands, and therefore 81 lands in total; the large chip 13 includes 216 signal lands and 9 power supply lands, and therefore 225 lands in total; and the intermediate chip 14 includes 160 signal lands and 9 power supply lands, and therefore 169 lands in total. It is also assumed that the pitch of the lands is 200 $\mu$m (=0.2 mm), and the pitch between adjacent the lands positioning the dicing line 17 therebetween is two times the pitch between adjacent the lands positioning no dicing line therebetween. Under these assumptions, the small IC chip 12 becomes 2×2 μm square, the large IC chip 13 becomes 3.2×3.2 mm square, and the intermediate IC chip 14 becomes 2.8×2.8 mm square.

In this embodiment, if a probe card for a function test is prepared to fit with the large IC chip 13, since the geometrical location of the power supply lands is congruent to the small IC chip 12, the large IC chip 13 and the intermediate IC chip 14, power supply probes of the probe card prepared to fit with the large IC chip 13 are in common to the small IC chip 12 the large IC chip 13 and the intermediate IC chip 14. In a function test under a wafer condition therefore, the probe card prepared to fit with the large IC chip 13 can be used in common to the small IC chip 12, the large IC chip 13 and the intermediate IC chip 14 by putting into an open circuit condition or into a high impedance condition at the processing apparatus side, probes of the probe card contacting the lands of adjacent IC chips when the probe card is applied to the small or intermediate IC circuit. On the other hand, the probes contacting the dicing line 17 is not required to be put in the open circuit condition or the high impedance condition at the processing apparatus side, since no land is provided on the dicing line 17.

Figure 5:
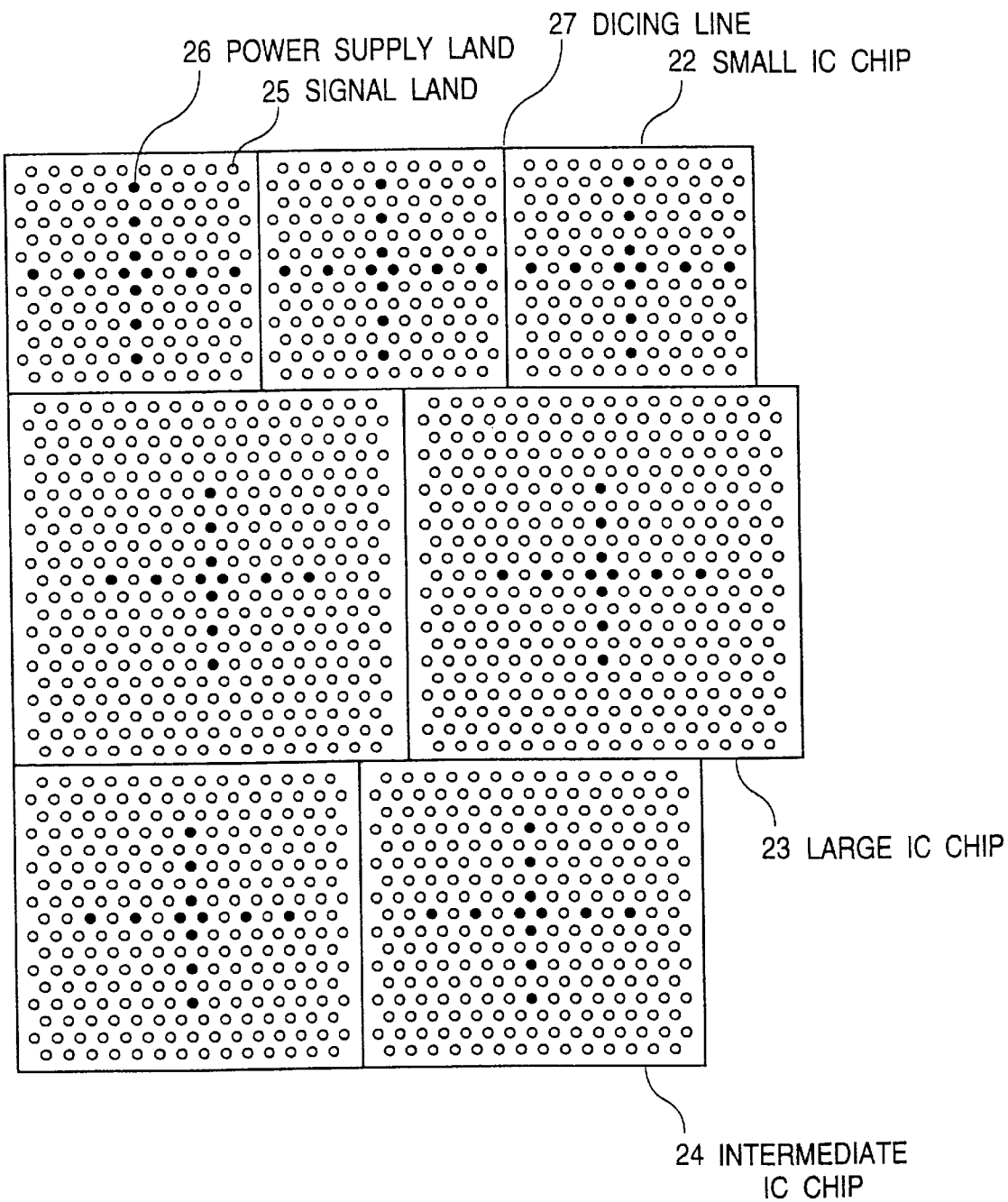
FIG. 5 is a view similar to FIG. 4, but illustrating a second embodiment of the wafer in accordance with the present invention.

Now, a second embodiment will be described with reference to FIG. 5 which is a view similar to FIG. 4, but illustrating the second embodiment of the wafer in accordance with the present invention.

In the wafer of the second embodiment, a plurality of small IC chips 22, a plurality of large IC chips 23, and a plurality of intermediate IC chips 24 are formed, similarly the first embodiment shown in FIG. 3.

Also similarly to the first embodiment, in each of the IC chips 22, 23 and 24, necessary devices (not shown) are formed, and an insulator film (also not shown) is formed to cover the whole surface of the IC chip, as well known to persons skilled in the art. In addition, at a number of positions of the IC chip surface, a portion of the insulator film is removed to expose an underlying conductive film, and a plurality of external signal connecting lands 25 are formed (124 signal lands in the small IC chip 22 as shown in FIG. 4), and a plurality of power supplying lands 26 (12 power supplying lands in the second embodiment) are located in the form of a cross having a crossing point positioned on a center of the IC chip, to have a geometrically congruent positional relation in all the small IC chips 22, the large IC chips 23, and the intermediate IC chips 24.

These lands 25 and 26 are plated by a solder or the like to form a bump, as well known to persons skilled in the art. The lands are distributed on the whole surface of the IC chip surface with the same pitches in three different directions separated from one another by the same angle (60°), excluding an area of a dicing line 27 partitioning the individual IC chips on the wafer, so as to form a repeated pattern of an equilateral triangle. The pitch between adjacent lands positioning the dicing line 27 therebetween is one obtained by multiplying the pitch between adjacent lands positioning no dicing line therebetween, by a positive integer.

Specifically, four power supplying lands 26 located in a center region of the IC chip are respectively positioned at four vertexes of a rhombus (formed by combining two equilateral triangles) having a center positioned on the center point of the IC chip.

In this second embodiment, the IC chips of three different chip sizes are formed on a single wafer, similarly to the first embodiment. However, in order to increase the density of the lands in comparison with the first embodiment, the lands are located in such a manner that each three adjacent lands are positioned at three vertexes of the equilateral triangle, respectively. In this embodiment, assuming that the pitch of the lands (the length of the sides of the equilateral triangle) is 200 μm (=0.2 mm), similarly to the first embodiment, the ratio of the area required to locate four lands in the first and second embodiments is as follows:

first embodiment:second embodiment
=0.2×0.2:0.2×√3×0.2×0.5
=0.04:0.0346
=1.156:1

Therefore, assuming that the same number of lands are provided on one IC chip, the second embodiment can reduce the area of the IC chip by about 15%, in comparison with the first embodiment.

As seen from the above, according to the present invention, the following advantages can be obtained in comparison with the prior art examples.

A first advantage is that even if IC chips of different chip sizes are formed on a single wafer, the testing tool used in a wafer condition can be used in common to all the IC chips of different chip sizes, and therefore, a continuos testing becomes possible in the wafer condition. The reason for this is that the power can be supplied to each of the IC chips of different chip sizes by use of the common testing tool, with no necessity of modifying the power supplying positions of the testing tool.

A second advantage is that even if IC chips of different chip sizes are formed on a single wafer, a stable dicing is possible while maintaining the first advantages. The reason for this is that, since the pitch between adjacent lands positioning the dicing line therebetween is one obtained by multiplying the pitch between adjacent lands positioning no dicing line therebetween, by a positive integer, even if the pitch between adjacent lands positioning no dicing line therebetween becomes small, a necessary dicing width can be ensured.

The invention has thus been shown and described with reference to the specific embodiments. However, it should be noted that the present invention is in no way limited to the details of the illustrated structures but changes and modifications may be made within the scope of the appended claims.

I claim:

1. A wafer having a plurality of integrated circuit chips of different chip sizes formed on the wafer, each of the integrated circuit chips having a number of externally connecting lands uniformly distributed over the whole surface of the chip with equal pitches in at least two different directions, a geometrical location of a plurality of power supply lands of said externally connecting lands being congruent to all said integrated circuit chips of different chip sizes.

2. A wafer claimed in claim 1 wherein said at least two different directions includes two directions orthogonal to each other, so that said number of externally connecting lands are distributed over the whole surface of each chip in the form of a matrix, and said plurality of power supply lands are located to depict a cross having a crossing point positioned at a center of the chip.

3. A wafer claimed in claim 2 wherein the pitch between adjacent lands positioning a dicing line therebetween is one obtained by multiplying the pitch between adjacent lands positioning no dicing line therebetween, by a positive integer.

4. A wafer claimed in claim 1 wherein said at least two different directions includes three different directions angularly separated from one another by the same angle, so that said number of externally connecting lands are distributed over the whole surface of each chip in such a manner that each three adjacent lands are positioned at three vertexes of an equilateral triangle, respectively, and therefore, a repeated pattern of the equilateral triangle is depicted by said lands, and said plurality of power supply lands are located to depict a cross having a crossing point positioned at a center of the chip.

5. A wafer claimed in claim 4 wherein the pitch between adjacent lands positioning a dicing line therebetween is one obtained by multiplying the pitch between adjacent lands positioning no dicing line therebetween, by a positive integer.

6. A wafer having a plurality of integrated circuit chips of different chip sizes formed on the wafer, each of the integrated circuit chips having a number of externally connecting lands uniformly distributed over the whole surface of the chip with equal pitches in two directions orthogonal to each other, so that said number of externally connecting lands are positioned in the form of a matrix, a geometrical location of a plurality of power supply lands of said externally connecting lands being congruent to all said integrated circuit chips of different chip sizes.

7. A wafer claimed in claim 6 wherein said plurality of power supply lands are located to depict a cross having a crossing point positioned at a center of the chip.

8. A wafer claimed in claim 7 wherein the pitch between adjacent lands positioning a dicing line therebetween is one obtained by multiplying the pitch between adjacent lands positioning no dicing line therebetween, by a positive integer.

9. A wafer having a plurality of integrated circuit chips of different chip sizes formed on the wafer, each of the integrated circuit chips having a number of externally connecting lands uniformly distributed over the whole surface of the chip with equal pitches in three different directions angularly separated from one another by the same angle, so that each three adjacent lands are positioned at three vertexes of an equilateral triangle, respectively, and therefore, a repeated pattern of the equilateral triangle is depicted by said land, a geometrical location of a plurality of power supply lands of said externally connecting lands being congruent to all said integrated circuit chips of different chip sizes.

10. A wafer claimed in claim 9 wherein said plurality of power supply lands are located to depict a cross having a crossing point positioned at a center of the chip.

11. A wafer claimed in claim 10 wherein the pitch between adjacent lands positioning a dicing line therebetween is one obtained by multiplying the pitch between adjacent lands positioning no dicing line therebetween, by a positive integer.

* * * * *